United States Patent [19]
Takahashi

[11] Patent Number: 5,828,087
[45] Date of Patent: Oct. 27, 1998

[54] ALINAS SEMICONDUCTOR DEVICE CONTANING SI AND P

[75] Inventor: Naoki Takahashi, Nara-ken, Japan

[73] Assignee: Sharp Kabushiki Kaisha, Osaka, Japan

[21] Appl. No.: 770,462

[22] Filed: Dec. 20, 1996

[30] Foreign Application Priority Data

Dec. 22, 1995 [JP] Japan ................................ 7-335028

[51] Int. Cl.⁶ .................................................. H01L 33/00
[52] U.S. Cl. ............................... 257/96; 257/97; 257/102; 257/192; 257/194; 257/197; 372/43; 372/45; 372/46
[58] Field of Search .................................. 257/197, 198, 257/192, 194, 187, 96, 97, 102; 372/43, 45, 46

[56] References Cited

U.S. PATENT DOCUMENTS

| | | | |
|---|---|---|---|
| 5,375,137 | 12/1994 | Hirayama et al. | 372/46 |
| 5,436,468 | 7/1995 | Nakata et al. | 257/15 |
| 5,448,585 | 9/1995 | Belenky et al. | 372/45 |
| 5,606,185 | 2/1997 | Nguyen et al. | 257/197 |
| 5,633,516 | 5/1997 | Mishima et al. | 257/190 |

FOREIGN PATENT DOCUMENTS 6-21105  1/1994  Japan .

*Primary Examiner*—William Mintel
*Attorney, Agent, or Firm*—Morrison & Foerster LLP

[57] ABSTRACT

The semiconductor device includes at least an Si-doped AlInAs layer formed on an InP substrate. The Si-doped AlInAs layer contains phosphorus.

7 Claims, 6 Drawing Sheets

ALINAS SEMICONDUCTOR DEVICE CONTANING SI AND P

BACKGROUND OF THE INVENTION

1. Field of the Invention

The present invention relates to a semiconductor device. More particularly, the present invention relates to a semiconductor device including semiconductor layers formed on an InP substrate.

2. Description of the Related Art

Various semiconductor devices including semiconductor layers formed on an InP substrate are known. Hereinafter, typical conventional semiconductor devices will be described.

An exemplary AlInAs/GaInAs heterojunction bipolar transistor 400 is shown in FIG. 10. The heterojunction bipolar transistor 400 includes an Si-doped GaInAs collector layer 402, a C-doped GaInAs base layer 403, an Si-doped AlInAs emitter layer 404 and an Si-doped GaInAs cap layer 405 formed on a semi-insulative InP substrate 401 in this order. Furthermore, an emitter electrode 410 made of AuGe/Ni/Au is provided on the cap layer 405; a base electrode 409 made of AuZn/Ni/Au is provided on the base layer 403; and a collector electrode 408 made of AuGe/Ni/Au is provided on the collector layer 402. Shaded portions shown in FIG. 10 are alloy regions of the electrodes and the semiconductor layers. The Si-doped GaInAs cap layer 405 passivates the Si-doped AlInAs emitter layer 404 so as to reduce an ohmic resistance, thereby stabilizing the device.

An exemplary AlInAs/GaInAsP semiconductor laser light emitting device 500 is shown in FIG. 11. The semiconductor laser light emitting device 500 includes an Si-doped AlInAs cladding layer 502, an undoped GaInAsP active layer 503 and a C-doped AlInAs cladding layer 504 formed on an S-doped InP substrate 501 in this order. An ohmic electrode 510 made of AuZn/Ni/Au is provided on the C-doped AlInAs cladding layer 504 and an ohmic electrode 511 made of AuGe/Ni/Au is provided beneath the S-doped InP substrate 501. Shaded portions shown in FIG. 11 are alloy regions of the electrodes and the semiconductor layers. A multi-layer film 512 made of $Si/Al_2O_3$ is formed on light emitting surfaces of the laser light emitting device 500 by a conventional deposition method.

An exemplary AlInAs/GaInAs MESFET (metal semiconductor field effect transistor) 600 is shown in FIG. 12. The MESFET 600 includes an undoped AlInAs buffer layer 602, an Si-doped GaInAs channel layer 603, an Si-doped AlInAs electron supplying layer 604, an undoped AlInAs Schottky layer 605, an Si-doped AlInAs first cap layer 607 and an Si-doped GaInAs second cap layer 608 formed on a semi-insulative InP substrate 601 in this order. A recess groove 620 is formed generally in the middle portion of the Si-doped GaInAs cap layer 608 so as to reach the surface of the undoped AlInAs Schottky layer 605 by so-called recess etching. A gate electrode 610 is provided on the exposed surface of the undoped AlInAs Schottky layer 605. Moreover, a source electrode 611 and a drain electrode 612 are separately provided on the Si-doped GaInAs cap layer 608. The cap layers 607 and 608 reduce the ohmic contact resistance, e.g., of the source electrode 611 or the drain electrode 612 without allowing any alloy to be formed, thereby stabilizing the device.

Hereinafter, problems associated with conventional semiconductor devices will be described.

For instance, an Si-doped AlInAs layer (carrier concentration: $5 \times 10^{18}$ cm$^{-3}$) epitaxially grown on an InP substrate is known to allow the carrier concentration thereof to be decreased to approximately $1 \times 10^{12}$ cm$^{-3}$ upon heat treatment in a nitrogen atmosphere at a temperature of 300° C. or more which is performed after a surface of an Si-doped AlInAs layer is oxidized by exposure to a plasma generated from $O_2$ (Extended Abstract of the 54th Autumn Meeting of the Japan Society of Applied Physics 20a-2P-10, p.1242).

In the process of producing the heterojunction bipolar transistor 400 shown in FIG. 10, the Si-doped AlInAs collector layer 402 and the Si-doped AlInAs emitter layer 404 are oxidized. Therefore, in a subsequent heat treatment, Si atoms (i.e., a dopant) in the Si-doped AlInAs collector layer 402 and the Si-doped AlInAs emitter layer 404 bond with the diffused O atoms. Hence, the Si atoms in the collector layer 402 and the emitter layer 404 no longer act as a dopant and thus a carrier concentration of the Si-doped AlInAs collector layer 402 and the Si-doped AlInAs emitter layer 404 is decreased. Consequently, the emitter-base resistance and the base-collector resistance are increased, whereby a maximum oscillation frequency $f_{max}$ and a cut-off frequency $f_t$ are deteriorated.

In the process of producing the laser light emitting device 500 shown in FIG. 11, the Si-doped AlInAs cladding layer 502 is oxidized. Therefore in a subsequent heat treatment, Si atoms (i.e., a dopant) in the cladding layer 502 bond with the diffused O atoms. Hence, the Si atoms in the cladding layer 502 no longer act as a dopant and thus a carrier concentration of the cladding layer 502 is decreased, whereby a threshold current is increased.

As a result, the device generates more heat, resulting in a positive feedback, leading to device deterioration.

Similarly, during the process of producing the MESFET 600 shown in FIG. 12, the Si-doped AlInAs first cap layer 607 is oxidized. Therefore, in a subsequent heat treatment, Si atoms (i.e., a dopant) in the Si-doped AlInAs first cap layer 607 bond with the diffused O atoms. Hence, the Si atoms in the first cap layer 607 no longer act as a dopant and thus the carrier concentration of the first cap layer 607 is decreased, whereby the ohmic property of the source electrode or the drain electrode is lowered and a mutual conductance gm is deteriorated.

Thus, a semiconductor device having stable quality and high reliability is desired in which bonding of Si atoms and O atoms in an oxidized Si-doped AlInAs layer during the production process is minimized so that the carrier concentration thereof remains high.

SUMMARY OF THE INVENTION

In accordance with one aspect of the present invention, a semiconductor device includes at least an Si-doped AlInAs layer formed on an InP substrate. The Si-doped AlInAs layer contains phosphorus.

In accordance with another aspect of the present invention, a semiconductor device includes a heterojunction bipolar transistor having an emitter region of a first conductivity, a base region of a second conductivity and a collector region of a first conductivity on a substrate. The emitter region of the first conductivity or the collector region of the first conductivity includes an Si-doped AlInAs layer containing phosphorus.

In one embodiment of the present invention, an amount of phosphorus contained in the Si-doped AlInAs layer is in the range of $10^{16}$ cm$^{-3}$ to $10^{21}$ cm$^{-3}$.

In accordance with another aspect of the present invention, a semiconductor device includes a semiconductor light emitting device having a cladding layer of a first conductivity, an active layer and a cladding layer of a second conductivity. The cladding layer of the first conductivity or the cladding layer of the second conductivity includes an Si-doped AlInAs layer containing phosphorus.

In one embodiment of the present invention, an amount of phosphorus contained in the Si-doped AlInAs layer is in the range of $10^{16}$ cm$^{-3}$ to $10^{21}$ cm$^{-3}$.

In accordance with another aspect of the present invention, a semiconductor device includes a field effect transistor having a channel layer defining a conductive path for carriers, a Schottky layer formed of an element selected from the group consisting of In, Ga, Al, As and P, an Si-doped AlInAs first cap layer, and an Si-doped GaInAs second cap layer provided on a substrate in this order, in which an ohmic contact is made by a source electrode and a drain electrode provided on prescribed regions of a surface of the second cap layer. The Si-doped AlInAs layer contains phosphorus.

In one embodiment of the present invention, an amount of phosphorus contained in the Si-doped AlInAs layer is in the range of $10^{16}$ cm$^{-3}$ to $10^{21}$ cm$^{-3}$.

In accordance with another aspect of the present invention, a method for producing a semiconductor device having at least an Si-doped AlInAs layer formed on an InP substrate includes a step of doping the Si-doped AlInAs layer with phosphorus while growing the Si-doped AlInAs layer.

In one embodiment of the present invention, the method further includes the steps of performing an $O_2$ plasma treatment and performing a heat treatment after the step of doping the Si-doped AlInAs layer with phosphorus while growing the Si-doped AlInAs layer.

Thus, the invention described herein makes possible the advantages of (1) providing a semiconductor device having a high carrier concentration and thus having stable quality and high reliability, and (2) providing a method for easily producing such a semiconductor.

These and other advantages of the present invention will become apparent to those skilled in the art upon reading and understanding the following detailed description with reference to the accompanying figures.

DESCRIPTION OF THE PREFERRED EMBODIMENTS

Figure 1:
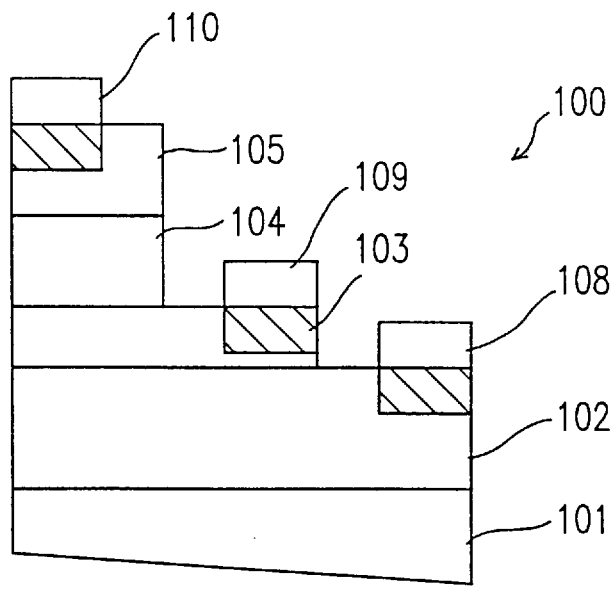
FIG. 1 is a schematic cross-sectional view showing an AlInAs/InP heterojunction bipolar transistor according to a preferred embodiment of the present invention.

A semiconductor device according to the present invention includes at least an Si-doped AlInAs layer on a substrate, the Si-doped AlInAs layer containing phosphorus. Examples of applications of the semiconductor device of the invention include a heterojunction bipolar transistor, a semiconductor laser light emitting device and a MESFET.

First, functions of a semiconductor device according to the present invention will be described. The present inventor has realized the present invention based on experiments and studies, and has confirmed the following facts via experimentation:

When the surface of an Si-doped AlInAs layer (carrier concentration: $5\times10^{18}$ cm$^{-3}$, thickness: 50 nm) provided on an InP substrate is oxidized with $O_2$ plasma and subjected to heat treatment in a nitrogen atmosphere at a temperature of 300° C. to 500° C., the carrier concentration of the layer is decreased to $1\times10^{16}$ cm$^{-3}$. On the other hand, when an Si-doped AlInAs layer containing phosphorus is subjected to the same process, the carrier concentration of the layer remains at $5\times10^{18}$ cm$^{-3}$.

In the case where phosphorus is contained in an Si-doped AlInAs layer provided on a substrate, even when the exposed surface of the Si-doped AlInAs layer is oxidized in an oxygen atmosphere or by $O_2$ plasma prior to heat treatment, the Si atoms (i.e., a dopant) in the Si-doped AlInAs layer hardly bond with the diffused O atoms since the O atoms are mainly bonded with the P atoms. Accordingly, the Si atoms in the Si-doped AlInAs layer continue to act as a dopant and thus the carrier concentration of the Si-doped AlInAs layer is not decreased.

Furthermore, similar experiments are conducted while varying the doped amount of phosphorus. When the doped amount of phosphorus is equivalent to or more than the doped amount of Si, little change in the carrier concentration is observed. Specifically, even when a surface of an Si-doped AlInAs layer is oxidized by $O_2$ plasma and subjected to heat treatment at a temperature as high as 500° C., the decrease of a carrier concentration is within the range of experimental errors. On the other hand, when the doped amount of phosphorus exceeds $10^{21}$ cm$^{-3}$, the lattice constant substantially changes, thereby causing deterioration of the crystallinity of the Si-doped AlInAs layer.

Moreover, similar studies were performed for the case where phosphorus is doped in a growth of Si-doped AlInAs layer using a molecular beam epitaxy device and for the case where phosphorus is doped in a growth of Si-doped AlInAs layer using an MOCVD device (where the doped amount of phosphorus is equal to or higher than the doped amount of Si and equal to or lower than $10^{21}$ cm$^{-3}$). In either case, the carrier concentration of the Si-doped AlInAs layer exhibits no change.

During the actual production of a semiconductor device, the face of an Si-doped AlInAs layer, that is exposed by etching, as well as the side faces thereof, is oxidized and subjected to heat treatment by which O atoms are diffused in the Si-doped AlInAs layer. The diffused O atoms, however, hardly bond with the Si atoms in the Si-doped AlInAs layer containing phosphorus since the O atoms mainly bond with P atoms. Accordingly, the Si atoms in the Si-doped AlInAs layer remain to act as a dopant, and thus a carrier concentration of the Si-doped AlInAs layer is not decreased.

Japanese Laid-Open Patent Publication No. 6-21105 proposes a technique in which a phosphide layer is provided on an exposed surface of an undoped AlInAs Schottky layer of a field effect transistor, for example, by $PH_3$ plasma treatment. According to this technique, the undoped AlInAs Schottky layer is prevented from being oxidized so that the undoped AlInAs Schottky layer is restrained from becoming a depletion layer. As a result, the source-gate serial resistance is prevented from increasing and mutual conductance is prevented from deteriorating, and at the same time the barrier height of the Schottky junction of the undoped AlInAs Schottky layer and the gate electrode is increased. Consequently, the gate leak current can be minimized and the withstand level against the gate voltage can be enhanced. However, the technique is not applicable to a current controlling type semiconductor device such as heterojunction bipolar transistor. The reason is that the technique mainly aims to prevent the oxidation of the undoped AlInAs layer, or preventing the undoped characteristics of the undoped AlInAs layer (i.e., a layer with an extremely low carrier concentration) from deteriorating, whereas the present invention provides an excellent semiconductor device by minimizing the decrease in the carrier concentration of an Si-doped AlInAs layer (i.e., a layer with a high carrier concentration). At least in this regard, the present invention cannot be realized based on the disclosure of Japanese Laid-Open Patent Publication No. 6-21105.

The present inventor has studied an actual semiconductor device in terms of its characteristics and reliability, by varying the doped amount of phosphorus in an Si-doped AlInAs layer. As a result, it has been found that, in actual semiconductor devices too, once the doped amount of the phosphorus exceeds $10^{21}$ cm$^{-3}$, the change in the lattice constant becomes significant and the crystallinity deteriorates since the phosphorus tends to bond with group-III atoms during successive growth of semiconductor layers on a substrate. Usually, the doped amount of Si in the Si-doped AlInAs layer is at least about $1 \times 10^{16}$ cm$^{-3}$. It has been found that when the amount of phosphorus is less than the amount of Si, the carrier concentration of the Si-doped AlInAs layer decreases during the production of the semiconductor device. In this regard, the doped amount of phosphorus in a phosphorus-containing Si-doped AlInAs layer is preferably in the range of $10^{16}$ cm$^{-3}$ to $10^{21}$ cm$^{-3}$ and more preferably, in the range of $10^{18}$ cm$^{-3}$ to $5 \times 10^{20}$ cm$^{-3}$.

In the case where the present invention is applied to a heterojunction bipolar transistor, decrease in the carrier concentration of an Si-doped AlInAs collector layer and an Si-doped AlInAs emitter layer can be minimized, thereby preventing the deterioration of a current amplification factor $\beta$, a maximum oscillation frequency $f_{max}$ and a cut-off frequency $f_t$. Accordingly, a highly reliable heterojunction bipolar transistor is obtained. The amount of phosphorus doped in the Si-doped AlInAs collector layer and the Si-doped AlInAs emitter layer is preferably in the range of $10^{16}$ cm$^{-3}$ to $10^{21}$ cm$^{-3}$ and more preferably in the range of $10^{18}$ cm$^{-3}$ to $5 \times 10^{20}$ cm$^{-3}$. If the doped amount of phosphorus exceeds $10^{21}$ cm$^{-3}$, the lattice constant significantly changes due to the bonding of P atoms with group-III atoms during successive growth of semiconductor layers on the substrate. Hence, the crystallinity of semiconductor layers of the device is deteriorated. On the other hand, if the doped amount of phosphorus is smaller than the doped amount of Si, the carrier concentration of the Si-doped AlInAs layer is decreased during the production process of the semiconductor device.

In the case where the present invention is applied to a semiconductor laser light emitting device, the carrier concentration of an Si-doped AlInAs cladding layer is prevented from decreasing, and thus the increase in the threshold current is minimized. Accordingly, the device is restrained from generating heat, whereby deterioration of the device is prevented. Similarly, in the case where the present invention is applied to a light emitting diode, the device is prevented from deterioration. The doped amount of phosphorus in the Si-doped AlInAs layer of the semiconductor laser light emitting device or the light emitting diode is preferably in the range of $10^{16}$ cm$^{-3}$ to $10^{21}$ cm$^{-3}$ and more preferably in the range of $10^{18}$ cm$^{-3}$ to $5 \times 10^{20}$ cm$^{-3}$. If the doped amount of phosphorus exceeds $10^{21}$ cm$^{-3}$, the lattice constant remarkably changes due to the bonding of phosphorus with group-III atoms during successive growth of semiconductor layers on the substrate. Hence, the crystallinity of semiconductor layers of the device is deteriorated. On the other hand, if the doped amount of phosphorus is smaller than the doped amount of Si, the carrier concentration of the Si-doped AlInAs layer is decreased during the production process of the semiconductor device.

In the case where the present invention is applied to an MESFET, the carrier concentration of an Si-doped AlInAs first cap layer is prevented from decreasing and thus the ohmic properties of the source electrode or the drain electrode are prevented from deteriorating. As a result, the deterioration of mutual conductance is minimized. The doped amount of phosphorus in the Si-doped AlInAs layer of the MESFET is preferably in the range of $10^{16}$ cm$^{-3}$ to $10^{21}$ cm$^{-3}$ and more preferably in the range of $10^{18}$ cm$^{-3}$ to $5 \times 10^{20}$ cm$^{-3}$. If the doped amount of phosphorus exceeds $10^{21}$ cm$^{-3}$, the lattice constant remarkably changes due to the bonding of phosphorus with group-III atoms upon successive growth of semiconductor layers on the substrate. Hence, the crystallinity of semiconductor layers of the device is deteriorated. On the other hand, if the doped amount of phosphorus is smaller than the doped amount of Si, the carrier concentration of the Si-doped AlInAs layer is decreased during the production of the semiconductor device.

According to the present invention, a highly reliable semiconductor device with stable quality is obtained due to an Si-doped AlInAs layer containing phosphorus, regardless of the type of semiconductor device.

Hereinafter, the present invention will be described by way of illustrative embodiments with reference to the accompanying drawings. The present invention, however, is not limited thereto.

Embodiment 1

An AlInAs/InP heterojunction bipolar transistor according to a preferred embodiment of the present invention will now be described. The heterojunction bipolar transistor includes an emitter region of a first conductivity, a base region of a second conductivity and a collector region of a first conductivity on a substrate.

FIG. 1 is a schematic cross-sectional view showing the heterojunction bipolar transistor 100. The heterojunction bipolar transistor 100 includes an Si- and P-doped AlInAs collector layer 102, a Be-doped GaInAs base layer 103, an Si- and P-doped AlInAs emitter layer 104 and an Si-doped GaInAs cap layer 105 sequentially provided on a semi-insulative InP substrate 101. Moreover, an emitter electrode 110 made of AuGe/Ni/Au or the like is provided on the cap layer 105; a base electrode 109 made of AuZn/Ni/Au or the like is provided on the base layer 103; and a collector electrode 108 made of AuGe/Ni/Au or the like is provided on the collector layer 102. Alloy regions of the electrodes and the semiconductor layers are formed immediately beneath the electrodes (shown as shaded regions in FIG. 1).

The heterojunction bipolar transistor 100 is produced by the following steps.

(1) A semi-insulative InP substrate 101 is placed in a growing room of a molecular beam epitaxy device.

Then, under the pressure of As, the substrate 101 is subjected to heat treatment while being maintained at 520° C. for 3 minutes to remove an oxide film which exists on the substrate 101. Subsequently, the substrate is cooled down to and maintained at 490° C. Then, the layers were sequentially grown on the surface of the substrate.

Figure 2:
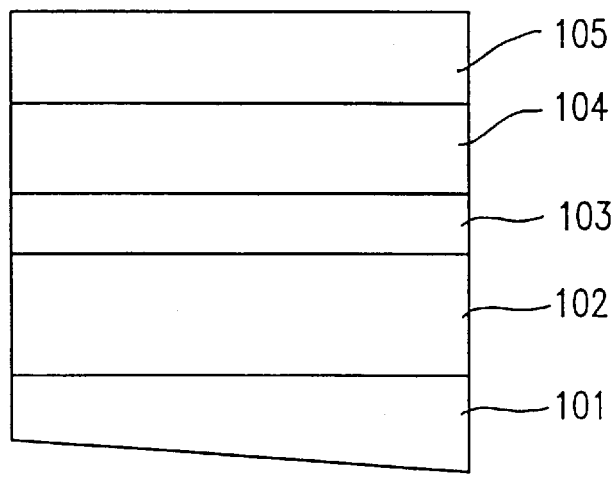
FIG. 2 is a schematic view for illustrating a process of producing the AlInAs/InP heterojunction bipolar transistor shown in FIG. 1.

More specifically, the molecular beam epitaxy device is used as follows. While a P cell (i.e., the cell in which phosphorus is contained) is maintained at a temperature of 150° C., a P cell shutter is opened as soon as the growth of an Si-doped AlInAs layer is started, and the P cell shutter is closed as soon as a prescribed thickness of the Si-doped AlInAs layer is obtained. In other words, phosphorus is doped while growing an Si-doped AlInAs layer, whereby the Si- and P-doped AlInAs collector layer 102 (doped amount of Si: $5\times10^{18}$ cm$^{-3}$, doped amount of P: $5\times10^{20}$ cm$^{-3}$, thickness: 1000 nm) is formed. Subsequently, the Be-doped GaInAs base layer 103 (doped amount of Be: $1\times10^{19}$ cm$^{-3}$, thickness: 100 nm) is grown. Then, the P cell shutter is opened as soon as the growth of an Si-doped AlInAs layer is started, and the P cell shutter is closed as soon as a prescribed thickness of the Si-doped AlInAs layer is obtained. In other words, in a manner like the Si- and P-doped AlInAs collector layer 102, phosphorus is doped while growing an Si-doped AlInAs layer, whereby an Si and P-doped AlInAs emitter layer 104 (doped amount of Si: $5\times10^{17}$ cm$^{-3}$, doped amount of P: $5\times10^{20}$ cm$^{-3}$, thickness: 200 nm) is formed. Thereafter, the Si-doped GaInAs cap layer 105 (doped amount of Si: $1\times10^{19}$ cm$^{-3}$, thickness: 200 nm) is grown. In such a manner, the substrate 101 having semiconductor layers formed thereon as shown in FIG. 2 is obtained.

Figure 3:
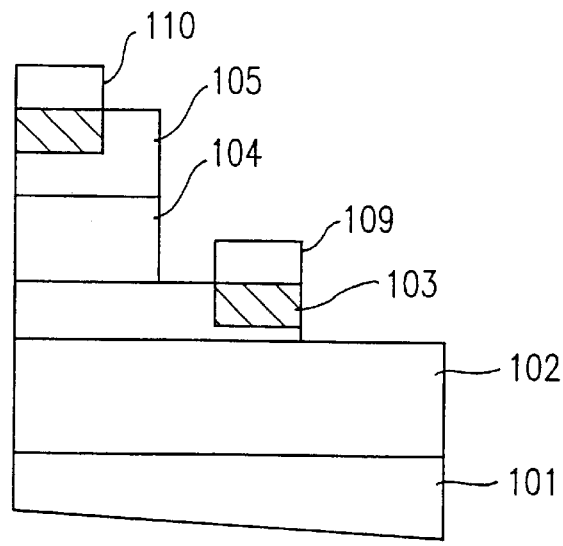
FIG. 3 is a schematic view for illustrating the process of producing the AlInAs/InP heterojunction bipolar transistor shown in FIG. 1.

(2) Then, as shown in FIG. 3, the substrate 101 having semiconductor layers thereon is taken out of the molecular beam epitaxy device before commencing the formation of the base electrode 109 and the emitter electrode 110. The base electrode 109 and the emitter electrode 110 are formed by a usual procedure of photolithography, etching, metallization and an alloying treatment using usual materials and under usual conditions. The process of forming the electrodes includes a step of ashing (i.e., $O_2$ plasma treatment) after the step of etching and/or metallization. The conditions for ashing are, for example, as follows: $O_2$ gas partial pressure of 0.5 Torr; RF power of 50 W; a temperature of 150° C.; and time of 15 minutes. Additionally, the alloying treatment is a heat treatment performed, for example, under a nitrogen atmosphere at a temperature of 400° C. for 3 minutes.

(3) Thereafter, as shown in FIG. 1, the collector electrode 108 made of AuGe/Ni/Au or the like is provided on a surface of the AlInAs collector layer 102 by usual photolithography and etching as described in (2). Thus, the heterojunction bipolar transistor is completed.

Since phosphorus is contained in the Si-doped AlInAs emitter layer 104, even if an exposed portion of the emitter layer 104 is oxidized by ashing, and heated so that O atoms are diffused in the emitter layer 104, the O atoms mainly bond with P atoms and hardly bond with the Si atoms in the emitter layer 104. Accordingly, the decrease in a carrier concentration of the Si-doped AlInAs emitter layer 104 is minimized and thus the emitter contact resistance is prevented from deteriorating (in fact, the decrease in the carrier concentration of the emitter layer can be minimized to be within the range of experimental errors).

The present inventor has studied the characteristics and the reliability of the device by varying the doped amount of phosphorus in the phosphorus-containing layer (i.e., the emitter layer or the collector layer). It has been found that the change in the lattice constant becomes significant as soon as the doped amount exceeds $10^{21}$ cm$^{-3}$ since phosphorus bonds with group-III atoms during successive growth of the semiconductor layers on the substrate. Hence, the crystallinity of semiconductor layers of the device is deteriorated. Usually, Si-doped AlInAs emitter or collector layer is doped with at least about $1\times10^{16}$ cm$^{-3}$ of Si. It has been further found that a carrier concentration of the Si-doped AlInAs layer is decreased during the production process of the heterojunction bipolar transistor 100 unless the doped amount of phosphorus is equal to or more than a doped amount of Si. Thus, the amount of phosphorus contained in the phosphorus-containing Si-doped AlInAs layer is preferably in the range of $10^{16}$ cm$^{-3}$ to $10^{21}$ cm$^{-3}$, and more preferably, in the range of $10^{18}$ cm$^{-3}$ to $5\times10^{20}$ cm$^{-3}$.

When similar studies are conducted on a heterojunction bipolar transistor having the structure shown in FIG. 1 which is produced employing an MOCVD device (using $PH_3$ or TBP as P dopant gas), no deterioration in the characteristics of the device (e.g., increase in the emitter contact resistance) is observed during the production process of the device.

Embodiment 2

Hereinafter, an AlInAs/GaInAsP laser light emitting device according to an another embodiment of the present invention will be described. The laser light emitting device includes a cladding layer of a first conductivity, an active layer and a cladding layer of a second conductivity formed on a substrate.

Figure 4:
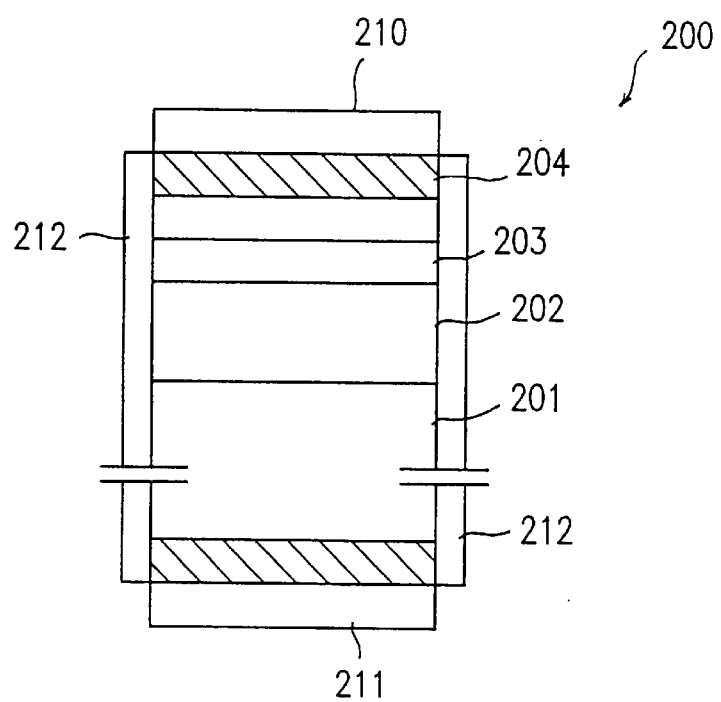
FIG. 4 is a schematic cross-sectional view showing an AlInAs/GaInAsP laser light emitting device according to an another embodiment of the present invention.

FIG. 4 is a schematic cross-sectional view showing the laser light emitting device 200. The laser light emitting device 200 includes an Si- and P-doped AlInAs cladding layer 202, an undoped GaInAsP active layer 203, and a C-doped AlInAs cladding layer 204 provided on an n-InP substrate 201 in this order. Moreover, an ohmic electrode 210 made of AuZn/Ni/Au or the like is provided on the cladding layer 204; and another ohmic electrode 211 made of AuGe/Ni/Au or the like is provided beneath the n-InP substrate 201. In FIG. 4, shaded portions represent alloy regions of the electrodes 210 and 211 with respective semiconductor layers. A multi-layer film 212 made of $Si/Al_2O_3$ is formed on light emitting surfaces by a conventional deposition method.

The semiconductor laser light emitting device 200 is produced by the following steps.

Figure 5:
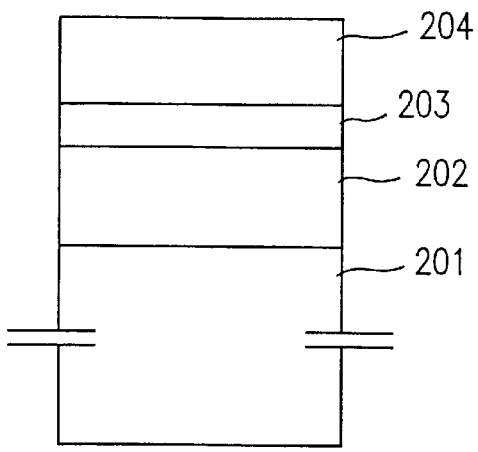
FIG. 5 is a schematic view for illustrating a process of producing the AlInAs/GaInAsP laser light emitting device shown in FIG. 4.

(1) An n-InP substrate 201 shown in FIG. 5 is placed in a growing room of a molecular beam epitaxy device.

Then, under the pressure of As, the substrate 201 is subjected to heat treatment while being maintained at 620° C. for 3 minutes to remove an oxide film which exists on the n-InP substrate 201. Subsequently, the substrate is cooled down to and maintained at 590° C. Then, the layers are sequentially grown on the surface of the substrate.

More specifically, the molecular beam epitaxy device is used as follows. While a P cell is maintained at a temperature of 150° C., a P cell shutter is opened as soon as the growth of an Si-doped AlInAs layer is started, and the P cell shutter is closed as soon as a prescribed thickness of the Si-doped AlInAs layer is obtained. In other words, phosphorus is doped while growing an Si-doped AlInAs layer, whereby the Si- and P-doped AlInAs cladding layer 202 (doped amount of Si: $5\times10^{18}$ cm$^{-3}$, doped amount of P: $5\times10^{20}$ cm$^{-3}$, thickness: 1000 nm) is formed. Subsequently, the undoped GaInAsP active layer 203 (thickness: 100 nm) and, finally, a C-doped AlInAs cladding layer 204 (doped amount of C: $5\times10^{18}$ cm$^3$, thickness: 2000 nm) are grown. Thus, the substrate 201 having semiconductor layers formed thereon as shown in FIG. 5 is obtained.

Figure 6:
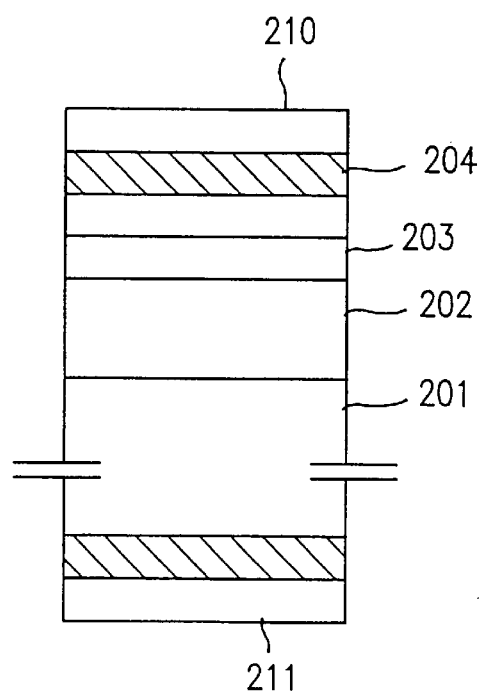
FIG. 6 is a schematic view for illustrating a process of producing the AlInAs/GaInAsP laser light emitting device shown in FIG. 4.

(2) Then, as shown in FIG. 6, the substrate 201 having semiconductor layers thereon is taken out of the molecular beam epitaxy device before commencing the formation of the ohmic electrodes 210 and 211. The ohmic electrodes 210 and 211 are formed by a usual procedure of photolithography, etching, metallization and an alloying treatment using typical materials and under general conditions. The process of forming the electrodes includes a step of ashing (i.e., O$_2$ plasma treatment) after the step of etching and/or metallization. The conditions for ashing are, for example, as follows: O$_2$ gas partial pressure of 0.5 Torr; RF power of 50 W; a temperature of 150° C.; and time of 15 minutes. Additionally, the alloying treatment is a heat treatment performed, for example, under a nitrogen atmosphere at a temperature of 400° C. for 3 minutes.

(3) Thereafter, as shown in FIG. 4, a multi-layer film 212 made of Si/Al$_2$O$_3$ is provided on light emitting surfaces by conventional photolithography. Thus, the semiconductor laser light emitting device is completed.

Since phosphorus is contained in the Si-doped AlInAs cladding layer 202, even if an exposed surface of the cladding layer 202 is oxidized by ashing, and heated so that O atoms are diffused in the cladding layer 202, the O atoms mainly bond with P atoms and hardly bond with the Si atoms in the cladding layer 202. Accordingly, the decrease in a carrier concentration of the Si-doped AlInAs cladding layer 202 is minimized and thus the ohmic contact resistance is prevented from deteriorating (in fact, the decrease in the carrier concentration of the cladding layer can be minimized to be within the range of experimental errors).

The present inventor has studied the characteristics and the reliability of the device by varying the doped amount of phosphorus in the phosphorus-containing layer (i.e., the cladding layer). It has been found that the change in the lattice constant becomes significant as soon as the doped amount exceeds $10^{21}$ cm$^{-3}$ since phosphorus bonds with group-III atoms during successive growth of the semiconductor layers on the substrate. Hence, the crystallinity of semiconductor layers of the device is deteriorated. Usually, Si-doped AlInAs cladding layer is doped with at least about $1\times10^{16}$ cm$^{-3}$ of Si. It has been further found that a carrier concentration of the Si-doped AlInAs layer is decreased during the production process of the semiconductor laser light emitting device 200 unless the doped amount of phosphorus is equal to or more than a doped amount of Si. Thus, the amount of phosphorus contained in the phosphorus-containing Si-doped AsInAs layer is preferably in the range of $10^{16}$ cm$^{-3}$ to $10^{21}$ cm$^{-3}$, and more preferably, in the range of $10^{18}$ cm$^{-3}$ to $5\times10^{20}$ cm$^{-3}$.

When similar studies are conducted on a semiconductor laser light emitting device having the structure shown in FIG. 4 which is produced employing an MOCVD device (using PH$_3$ or TBP as P dopant gas), no deterioration in the characteristics of the device (e.g., increase in the ohmic contact resistance) is observed during the production process of the device.

Embodiment 3

Hereinafter, an AlInAs/GaInAs MESFET according to still another embodiment of the present invention will be described. The MESFET includes a channel layer as a conducting path for carriers, a Schottky layer formed of elements selected from the group consisting of In, Ga, Al, As and P, an Si-doped AlInAs first cap layer, and an Si-doped GaInAs second cap layer sequentially provided on a substrate. An ohmic junction is formed by a source electrode and a drain electrode separately provided on prescribed portions of a surface of the second cap layer.

Figure 7:
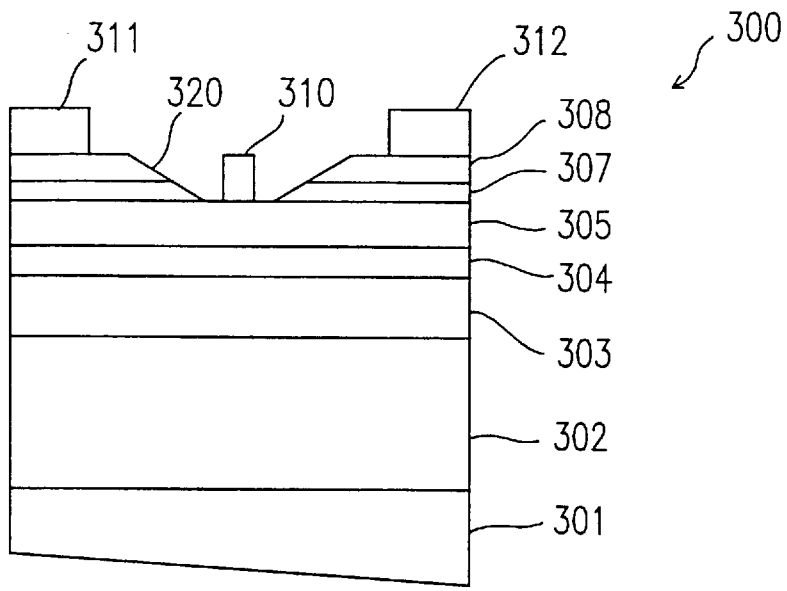
FIG. 7 is a schematic cross-sectional view showing an AlInAs/GaInAs MESFET according to a still another embodiment of the present invention.

FIG. 7 is a schematic cross-sectional view showing the MESFET 300. The MESFET 300 includes an undoped AlInAs buffer layer 302, an undoped GaInAs channel layer 303, an Si-doped AlInAs electron supplying layer 304, an undoped AlInAs Schottky layer 305, an Si and P-doped AlInAs first cap layer 307, and an Si-doped second GaInAs cap layer 308 provided on a semi-insulative InP substrate 301 in this order. A recess groove 320 is formed generally in the middle portion of the Si-doped GaInAs second cap layer 308 by so-called recess etching so as to reach the surface of the undoped AlInAs Schottky layer 305. A gate electrode 310 is provided on the exposed surface of the undoped AlInAs Schottky layer 305. Moreover, a source electrode 311 and a drain electrode 312 are separately provided on the Si-doped GaInAs second cap layer 308. The cap layers 307 and 308 reduce the ohmic contact resistance, e.g., of the source electrode 311 or the drain electrode 312 without allowing any alloy to be formed, thereby stabilizing the device.

The MESFET 300 is produced by the following steps.

(1) A semi-insulative InP substrate 301 is placed in a growing room of a molecular beam epitaxy device.

Then, under the pressure of As, the substrate 301 is subjected to heat treatment while being maintained at 520° C. for 3 minutes to remove an oxide film which exists on the semi-insulative substrate 301. Subsequently, the substrate is cooled down to and maintained at 490° C. Then, the undoped AlInAs buffer layer 302 (thickness: 500 nm), the undoped GaInAs channel layer 303 (thickness: 20 nm), the Si-doped AlInAs electron supplying layer 304 (doped amount of Si: $5\times10^{18}$ cm$^{-3}$, thickness: 5 nm) and the undoped AlInAs Schottky layer 305 (thickness: 30 nm) are sequentially grown on the substrate.

Figure 8:
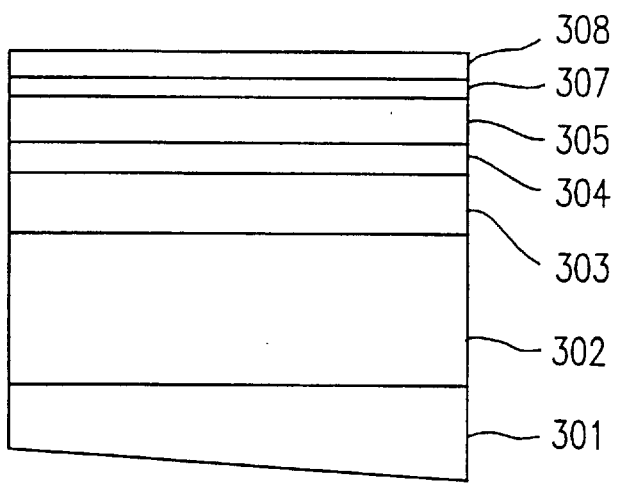
FIG. 8 is a schematic view for illustrating a process of producing the AlInAs/GaInAs MESFET shown in FIG. 7.

Then, while a P cell of the molecular beam epitaxy device is maintained at a temperature of 150° C., a P cell shutter is opened as soon as the growth of an Si-doped AlInAs layer is started, and the P cell shutter is closed as soon as a prescribed thickness of the Si-doped AlInAs layer is obtained. In other words, phosphorus is doped while growing an Si-doped AlInAs layer, whereby the Si- and P-doped AlInAs first cap layer 307 (doped amount of Si: $5\times10^{18}$ cm$^{-3}$, doped amount of P: $5\times10^{20}$ cm$^{-3}$, thickness: 5 nm) is formed. Finally, an Si-doped GaInAs second cap layer 308 (doped amount of Si: $5\times10^{18}$ cm$^{-3}$, thickness: 5 nm) is grown. Thus, the substrate 301 having semiconductor layers formed thereon as shown in FIG. 8 is obtained.

Figure 9:
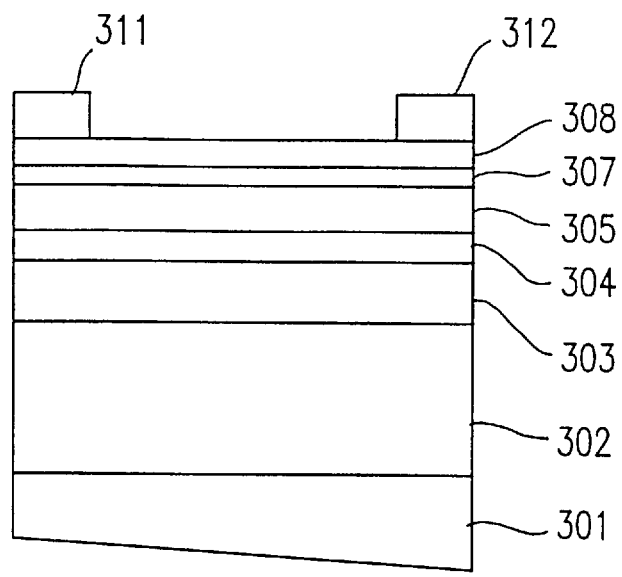
FIG. 9 is a schematic view for illustrating a process of producing the AlInAs/GaInAs MESFET shown in FIG. 7.
Figure 10:
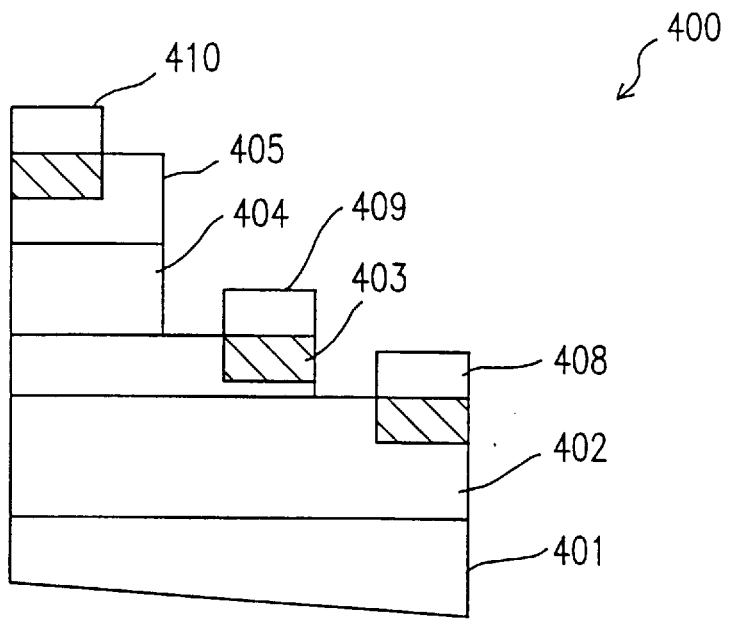
FIG. 10 is a schematic cross-sectional view showing a conventional AlInAs/GaInAs heterojunction bipolar transistor.
Figure 11:
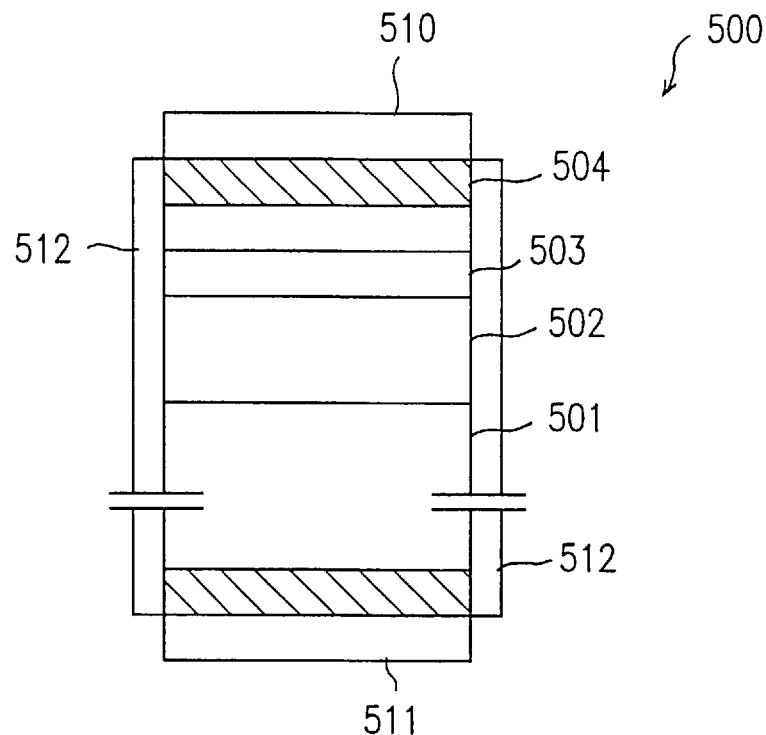
FIG. 11 is a schematic cross-sectional view showing a conventional AlInAs/GaInAsP laser light emitting device.
Figure 12:
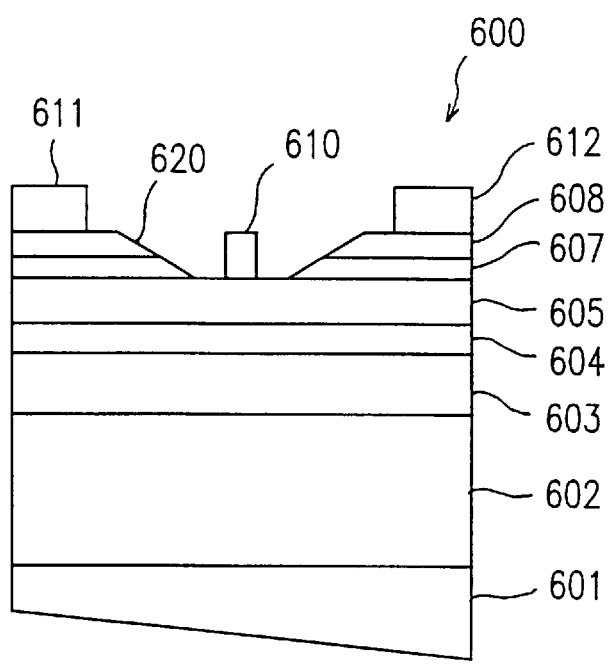
FIG. 12 is a schematic cross-sectional view showing a conventional recess-type AlInAs/GaInAs MESFET.

(2) Then, as shown in FIG. 9, the substrate 301 having semiconductor layers thereon is taken out of the molecular beam epitaxy device before commencing the formation of the source electrode 311 and the drain electrode 312 on both sides of the substrate having semiconductor layers (i.e., on both sides of the cap layer 308). The source electrode 311 and the drain electrode 312 are formed by a usual procedure of photolithography, etching, metallization and an alloying treatment using typical materials and under general conditions. The process of forming the electrodes includes a step of ashing (i.e., $O_2$ plasma treatment) after the step of etching and/or metallization. The conditions for ashing are, for example, as follows: $O_2$ gas partial pressure of 0.5 Torr; RF power of 50 W; a temperature of 150° C.; and time of 15 minutes. Additionally, the alloying treatment is a heat treatment performed, for example, under a nitrogen atmosphere at a temperature of 400° C. for 3 minutes. Furthermore, as shown in FIG. 7, a recess groove 320 is formed generally in the middle portion of the second cap layer 308 by so-called recess etching so as to reach the surface of the undoped AlInAs Schottky layer 305.

(3) Thereafter, as shown in FIG. 7, a gate electrode 310 made of Ti/Pt/Au is provided on the exposed surface of the undoped AlInAs Schottky layer 305 by usual photolithography and etching as described in (2). Thus, the MESFET 300 is completed.

Since phosphorus is contained in the Si-doped AlInAs first cap layer 307, even if an exposed surface of the first cap layer 307 is oxidized by ashing, and heated so that O atoms are diffused in the first cap layer 307, the O atoms mainly bond with P atoms and hardly bond with the Si atoms in the first cap layer 307. Accordingly, the decrease in a carrier concentration of the Si-doped AlInAs first cap layer 307 is minimized and thus a source resistance and a mutual conductance gm is prevented from deteriorating (in fact, the decrease in the carrier concentration of the first cap layer can be minimized to be within the range of experimental errors).

The present inventor has studied the characteristics and the reliability of the device by varying the doped amount of phosphorus in the phosphorus-containing layer (i.e., the first cap layer). It has been found that the change in the lattice constant becomes significant as soon as the doped amount exceeds $10^{21}$ cm$^{-3}$ since phosphorus bonds with group-III atoms during successive growth of the semiconductor layers on the substrate. Hence, the crystallinity of semiconductor layers of the device is deteriorated. Usually, Si-doped AlInAs first cap layer is doped with at least about $1\times10^{16}$ cm$^{-3}$ of Si. It has been further found that a carrier concentration of the Si-doped AlInAs layer is decreased during the production process of the MESFET 300 unless the doped amount of phosphorus is equal to or more than a doped amount of Si. Thus, the amount of phosphorus contained in the phosphorus-containing Si-doped AlInAs layer is preferably in the range of $10^{16}$ cm$^{-3}$ to $10^{21}$ cm$^{-3}$, and more preferably, in the range of $10^{18}$ cm$^{-3}$ to $5\times10^{20}$ cm$^{-3}$.

When similar studies are conducted on a MESFET having the structure shown in FIG. 7 which is produced employing an MOCVD device (using $PH_3$ or TBP as P dopant gas), no deterioration in the characteristics of device (e.g., increase in the source resistance, i.e., decrease in the saturation source-drain current, and decrease in the mutual conductance) is observed during the production process of the device.

Furthermore, studies were conducted on electric-field effect transistors, which are produced by a molecular beam epitaxy device or an MOCVD device and which exhibit the structure shown in FIG. 7 with the undoped AlInAs Schottky layer 305 being replaced by an undoped GaInP layer, an undoped AlInP layer, an InP layer or an InGaAlAsP layer. As a result, no deterioration (e.g., increase in a source resistance, i.e., decrease in a saturation source-drain current, and decrease in a mutual conductance) was confirmed.

According to the present invention, the carrier concentration of an Si-doped AlInAs layer is prevented from decreasing due to oxidation and heat treatment because phosphorus is contained in the Si-doped AlInAs layer. As a result, a highly reliable semiconductor device having high carrier concentration is provided with stable quality, and a method for producing such a semiconductor device is provided. The semiconductor device according to the present invention includes, for example, a heterojunction bipolar transistor having an excellent current amplification factor β, an excellent maximum oscillation frequency $f_{max}$ and an excellent cut-off frequency $f_t$; a semiconductor laser light emitting device that generates minimum heat and is thus less subject to degradation; and a field effect transistor having excellent source resistance and mutual conductance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising at least an Si-doped AlInAs layer formed on an InP substrate, wherein the Si-doped AlInAs layer contains phosphorus.

2. A semiconductor device comprising a heterojunction bipolar transistor including an emitter region of a first conductivity, a base region of a second conductivity and a collector region of a first conductivity on a substrate, wherein the emitter region of the first conductivity or the collector region of the first conductivity includes an Si-doped AlInAs layer containing phosphorus.

3. A semiconductor device according to claim 2, wherein an amount of phosphorus contained in the Si-doped AlInAs layer is in the range of $10^{16}$ cm$^{-3}$ to $10^{21}$ cm$^{-3}$.

4. A semiconductor device comprising a semiconductor light emitting device including a cladding layer of a first conductivity, an active layer and a cladding layer of a second conductivity, wherein the cladding layer of the first conductivity or the cladding layer of the second conductivity includes an Si-doped AlInAs layer containing phosphorus.

5. A semiconductor device according to claim 4, wherein an amount of phosphorus contained in the Si-doped AlInAs layer is in the range of $10^{16}$ cm$^{-3}$ to $10^{21}$ cm$^{-3}$.

6. A semiconductor device comprising a field effect transistor including a channel layer defining a conductive path for carriers, a Schottky layer formed of an element selected from the group consisting of In, Ga, Al, As and P, an Si-doped AlInAs first cap layer, and an Si-doped GaInAs second cap layer provided on a substrate in this order, in which an ohmic contact is made by a source electrode and a drain electrode provided on prescribed regions of a surface of the second cap layer, wherein the Si-doped AlInAs layer contains phosphorus.

7. A semiconductor device according to claim 6, wherein an amount of phosphorus contained in the Si-doped AlInAs layer is in the range of $10^{16}$ cm$^{-3}$ to $10^{21}$ cm$^{-3}$.

* * * * *